United States Patent
Oh et al.

(10) Patent No.: US 7,948,287 B2
(45) Date of Patent: May 24, 2011

(54) DLL CIRCUIT OF SEMICONDUCTOR MEMORY APPARATUS

(75) Inventors: Ic Su Oh, Ichon (KR); Kun Woo Park, Ichon (KR); Yong Ju Kim, Ichon (KR); Jong Woon Kim, Ichon (KR); Hee Wong Song, Ichon (KR); Hyung Soo Kim, Ichon (KR); Tae Jin Hwang, Ichon (KR)

(73) Assignee: Hynix Semiconductor Inc. (KR)

( * ) Notice: Subject to any disclaimer, the term of this patent is extended or adjusted under 35 U.S.C. 154(b) by 17 days.

(21) Appl. No.: 11/964,824

(22) Filed: Dec. 27, 2007

(65) Prior Publication Data

US 2009/0002040 A1    Jan. 1, 2009

(30) Foreign Application Priority Data

Jun. 28, 2007    (KR) .................. 10-2007-0064635

(51) Int. Cl.
    *H03L 7/06* (2006.01)
(52) U.S. Cl. .................................. 327/158
(58) Field of Classification Search ........... 327/151, 327/152, 147–150, 156–159; 375/375, 376; 331/1 R
    See application file for complete search history.

(56) References Cited

U.S. PATENT DOCUMENTS

| | | | |
|---|---|---|---|
| 6,313,676 B1 * | 11/2001 | Abe et al. ........................ | 327/158 |
| 6,327,318 B1 * | 12/2001 | Bhullar et al. ................. | 375/374 |
| 6,441,662 B2 * | 8/2002 | Ikeda ............................. | 327/160 |
| 6,765,976 B1 | 7/2004 | Oh | |
| 6,844,766 B2 * | 1/2005 | Sun .............................. | 327/284 |
| 6,853,225 B2 * | 2/2005 | Lee ............................... | 327/158 |
| 6,859,081 B2 | 2/2005 | Hong et al. | |
| 6,891,416 B2 * | 5/2005 | Miyamoto ..................... | 327/161 |
| 6,963,235 B2 | 11/2005 | Lee | |
| 7,035,148 B2 * | 4/2006 | Chung et al. .............. | 365/189.05 |
| 7,078,949 B2 * | 7/2006 | Kim et al. ..................... | 327/158 |
| 7,557,627 B2 * | 7/2009 | Lee et al. ...................... | 327/158 |
| 2004/0066873 A1 | 4/2004 | Cho et al. | |
| 2005/0275439 A1 | 12/2005 | Johnson | |

(Continued)

FOREIGN PATENT DOCUMENTS

JP    2004129255    4/2004

(Continued)

OTHER PUBLICATIONS

Xanthopoulos, et al., "The Design and Analysis of the Clock Distribution Network for a 1.2GHZ Alpha Microprocessor", ISSCC 2001/Session 25/Clock Generation and Distribution/25.6.

(Continued)

*Primary Examiner* — Lincoln Donovan
*Assistant Examiner* — Sibin Chen
(74) *Attorney, Agent, or Firm* — Baker & McKenzie LLP (57) ABSTRACT

A DLL circuit for a semiconductor memory apparatus includes a delay line having a coarse delay chain, which has a plurality of coarse delayers connected in series and is inputted with a reference clock signal, and a plurality of fine delayers which receive output clock signals of the respective coarse delayers, and a delay control section for comparing phases of an output clock signal of a final coarse delayer among the coarse delayers with the reference clock signal and generating coarse control signals for controlling the coarse delayers and for comparing phases of an output clock signal of a fine delayer inputted with the output clock signals of the final coarse delayer, as a fine feedback clock signal, with the reference clock signal and generating fine control signals for controlling the fine delayers.

25 Claims, 5 Drawing Sheets

U.S. PATENT DOCUMENTS

2005/0286672 A1* 12/2005 Lin et al. .................. 375/376
2006/0197565 A1 9/2006 Kang

FOREIGN PATENT DOCUMENTS

| | | |
|---|---|---|
| JP | 2005-243169 | 9/2005 |
| KR | 1020060079581 | 7/2006 |

OTHER PUBLICATIONS

Alvandpour, et al. "A 3.5GHz 32mW 150nm Multiphase Clock Generator for High-Performance Microprocessors", ISSCC 2003/Session 6/Low-Power Digital Techniques/Paper 6.6.

* cited by examiner

DLL CIRCUIT OF SEMICONDUCTOR MEMORY APPARATUS

CROSS-REFERENCES TO RELATED APPLICATION

The present application claims priority to Korean Patent Application number 10-2007-0064635, filed on Jun. 28, 2007, in the Korean Intellectual Property Office, the contents of which are incorporated herein by reference in their entirety as if set forth in full.

BACKGROUND

1. Technical Field

The embodiments described herein relate to a semiconductor memory apparatus, and more particularly, to a DLL (delay-locked loop) circuit for generating DLL clock signals.

2. Related Art

In general, a conventional DLL circuit is used to provide an internal clock signal the phase of which is faster by a specified time than a reference clock signal, which is obtained by converting an external clock signal. That is to say, a conventional DLL circuit is configured to make the phase of the internal clock signal faster by the specified time than the external clock signal so that output data can be output without delay with respect to the external clock signal.

Meanwhile, as the operation speed of conventional semiconductor memory apparatus increases, the ability of conventional semiconductor apparatus to output a large amount of data has also increased. In this regard, in order to output a large amount of data, a plurality of internal DLL clock signals having different phases are needed.

SUMMARY

A DLL circuit capable of generating a plurality of internal clock signals having different phases is described herein.

According to one aspect, a DLL circuit for a semiconductor memory apparatus comprises a delay line having a coarse delay chain, which has a plurality of coarse delayers connected in series and which receives a reference clock signal, and a plurality of fine delayers, which receive output clock signals of the respective coarse delayers, a delay control section configured to compare phases of an output clock signal of a final coarse delayer among the coarse delayers with the reference clock signal and to generate coarse control signals for controlling the coarse delayers. The coarse control signals can also be used for comparing phases of an output clock signal of a fine delayer that receives the output clock signals of the final coarse delayer, as a fine feedback clock signal, with the reference clock signal and for generating fine control signals for controlling the fine delayers. The DLL circuit can also include a duty cycle correction section having a plurality of unit duty cycle correctors configured to correct duty ratios of clock signals output by the fine delayers and to generate internal clock signals.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

Figure 1:
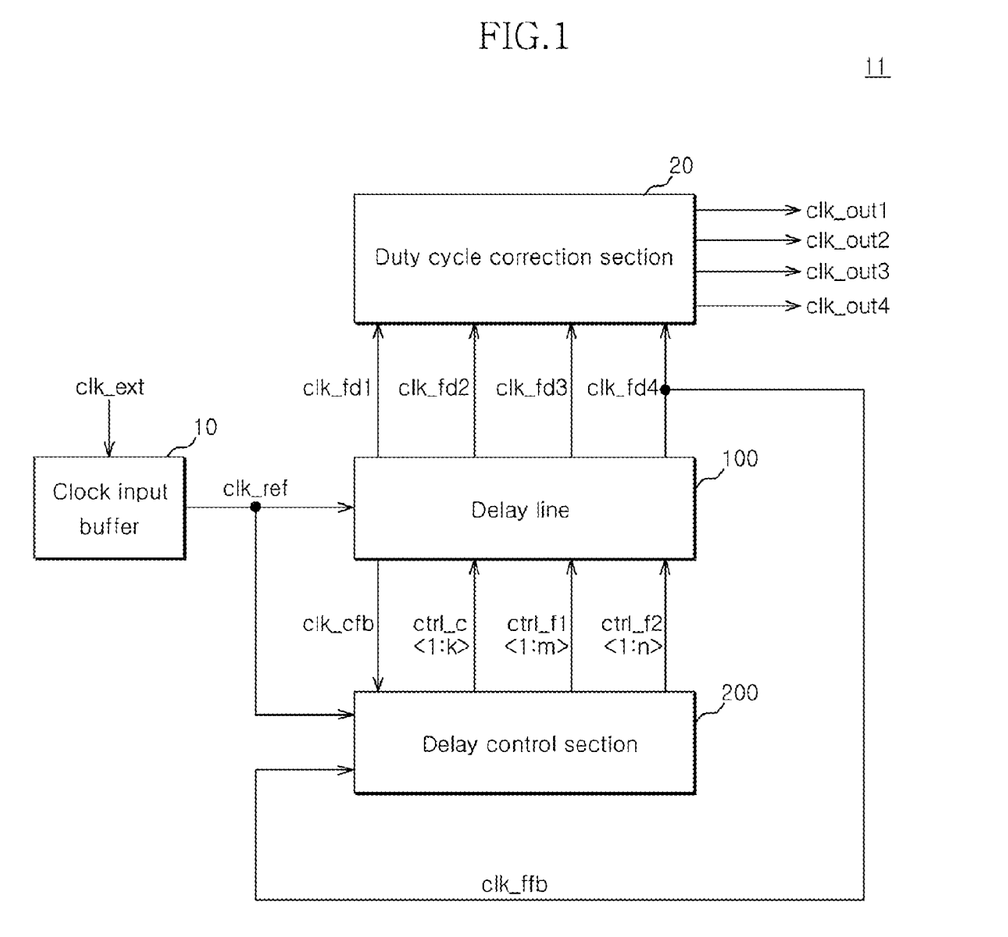
FIG. 1 is a block diagram illustrating a DLL circuit of a semiconductor memory apparatus in accordance with one embodiment.

FIG. 1 is a diagram illustrating a DLL circuit 11 configured in accordance with one embodiment. Referring to FIG. 1, the DLL circuit 11 can include a clock input buffer 10, a delay line 100, a delay control section 200, and a duty cycle correction section 20.

The clock input buffer 10 can be configured to convert the amplitude of an external clock signal 'clk_ext' and to generate a reference clock signal 'clk_ref'.

The delay line 100 can be configured to push-delay or pull-delay the reference clock signal 'clk_ref' in response to coarse control signals 'ctrl_c<1:k>' (where k is an integer number no less than 2) and to first and second fine control signals 'ctrl_f1<1:m>' and 'ctrl_f2<1:n>' (where m and n are integer numbers no less than 2) provided from the delay control section 200, and thereby generate a plurality of fine delay clock signals 'clk_fd1' through 'ckl_fd4' and a plurality of coarse delay clock signals 'clk_cd1' through 'clk_cd8' (see FIG. 3), which have different phases.

The delay control section 200 can be configured to receive the final coarse delay clock signal 'clk_cd8' among the plurality of coarse delay clock signals 'clk_cd1' through 'clk_cd8' (see FIG. 3) as a coarse feedback clock signal 'clk_cfb'. The delay control section 200 can also be configured to compare the phases of the coarse feedback clock signal 'clk_cfb' with the reference clock signal 'clk_ref' and to generate the coarse control signals 'ctrl_c<1:k>'. Also, the delay control section can receive the final fine delay clock signal 'clk_fd4' among the fine delay clock signals 'clk_fd1' through 'clk_fd4' as a fine feedback clock signal 'clk_ffb' compare the phases of the fine feedback clock signal 'clk_ffb' with the reference clock signal 'clk_ref', and generate the first and second fine control signals 'ctrl_f1<1:m>' and 'ctrl_f2<1:n>'.

The duty cycle correction section 20 can be configured to correct the duty ratios of the plurality of fine delay clock signals 'clk_fd1' through 'clk_fd4' and to generate a plurality of internal clock signals 'clk_out1' through 'clk_out4'.

Figure 2:
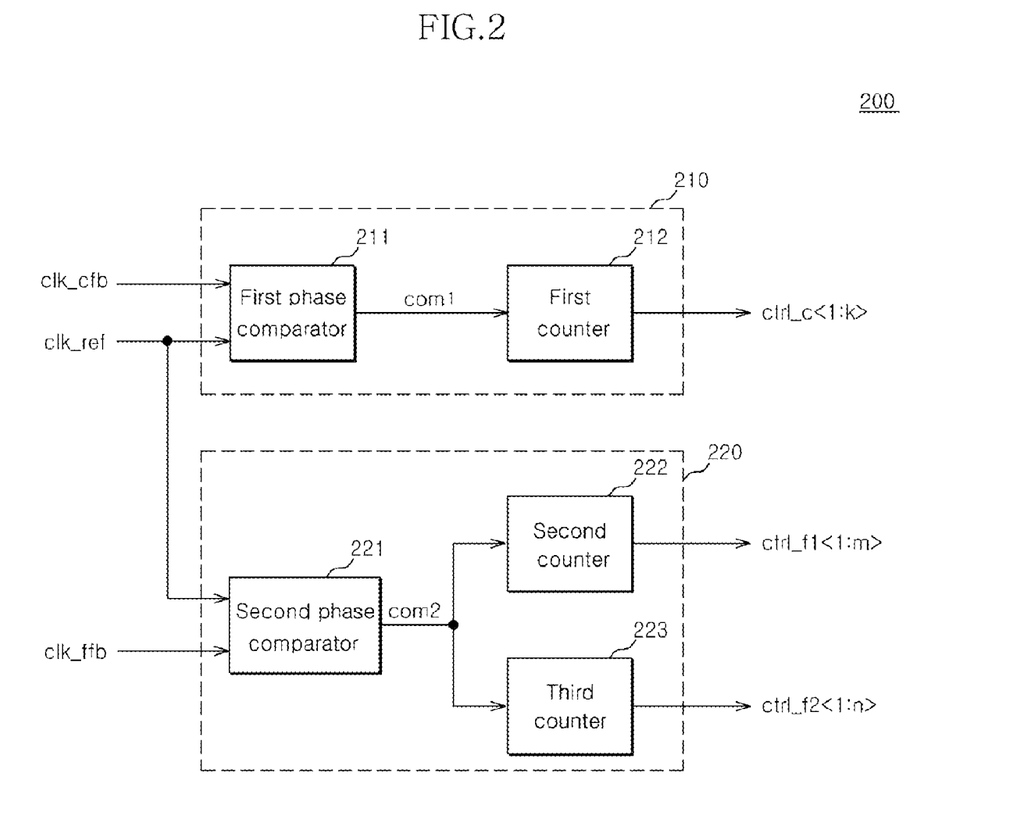
FIG. 2 is a block diagram illustrating a delay control section of the DLL circuit illustrated in FIG. 1.

Referring to FIG. 2, the delay control section 200 can include a coarse delay control section 210 and a fine delay control section 220. The coarse delay control section 210 can be configured to compare the phases of the coarse feedback clock signal 'clk_cfb' with the reference clock signal 'clk_ref' and to generate the coarse control signals 'ctrl_c<1:k>'. The coarse delay control section 210 can include a first phase comparator 211 and a first counter 212.

The first phase comparator 211 can be configured to compare the phases of the coarse feedback clock signal 'clk_cfb' with the reference clock signal 'clk_ref' and to generate a first comparison signal 'com1'. The first counter 212 can up-count or down-count the coarse control signals 'ctrl_c<1:k>' in response to the first comparison signal 'com1'.

The fine delay control section 220 can be configured to compare the phases of the fine feedback clock signal 'clk_ffb' with the reference clock signal 'clk_ref' and to generate the first and second fine control signals 'ctrl_f1<1:m>' and 'ctrl_f2<1:n>'. The fine delay control section 220 can include a second phase comparator 221, a second counter 222 and a third counter 223.

The second phase comparator 221 can be configured to compare the phases of the fine feedback clock signal 'clk_ffb' with the reference clock signal 'clk_ref' and to generate a second comparison signal 'com2'. The second counter 222 can up-count or down-count the first fine control signals 'ctrl_f1<1:m>' in response to the second comparison signal 'com2'.

The third counter 223 can up-count or down-count the second fine control signals 'ctrl_f2<1:n>' in response to the second comparison signal 'com2'. At this time, the second counter 222 and the third counter 223 can operate differently from each other in response to the second comparison signal 'com2'. For example, when the second comparison signal 'com2' is enabled, the second counter 222 can be configured to implement up-counting and the third counter 223 can be configured to implement down-counting.

Figure 3:
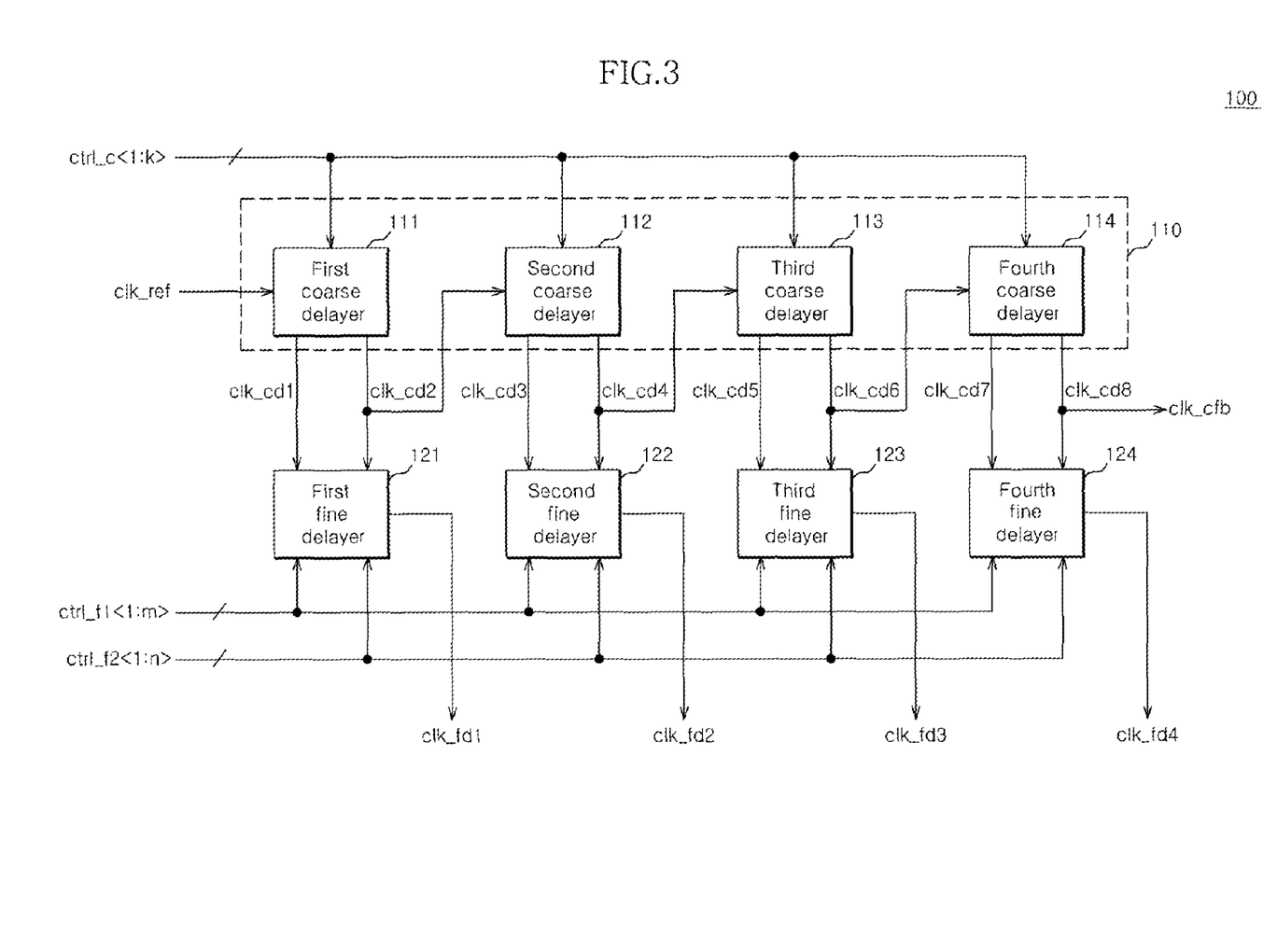
FIG. 3 is a block diagram illustrating a delay line of the DLL circuit illustrated in FIG. 1.

Referring to FIG. 3, it can be seen that the delay line 100 can include a coarse delay chain 110 and a plurality of fine delayers 121 through 124. The delay line 100 can include a coarse delay chain 110 having first through fourth coarse delayers 111 through 114, and first through fourth fine delayers 121 through 124.

The coarse delay chain 110 can be configured to delay the reference clock signal 'clk_ref' in response to the coarse control signals 'ctrl_c<1:k>' and to generate the plurality of coarse delay clock signals 'clk_cd1' through 'clk_cd8'. At this time, the total delay time of the coarse delay chain 110 can correspond to one period of the reference clock signal 'clk_ref'. The final coarse delay clock signal 'clk_cd8' among the plurality of coarse delay clock signals 'clk_cd1' through 'clk_cd8' can be received by the delay control section 200 as the coarse feedback clock signal 'clk_cfb'.

In the coarse delay chain 110, the plurality of coarse delayers 111 through 114 can be connected in series and configured to generate respective pairs of coarse delay clock signals 'clk_cd1' and 'clk_cd2', 'clk_cd3' and 'clk_cd4', 'clk_cd5' and 'clk_cd6', and 'clk_cd7' and 'clk_cd8'.

The first coarse delayer 111 can be configured to output the first and second coarse delay clock signals 'clk_cd1' and 'clk_cd2', the second coarse delayer 112 can be configured to output the third and fourth coarse delay clock signals 'clk_cd3' and 'clk_cd4' the third coarse delayer 113 can be configured to output the fifth and sixth coarse delay clock signals 'clk_cd5' and 'clk_cd6', and the fourth coarse delayer 114 can be configured to output the seventh and eighth coarse delay clock signals 'clk_cd7' and 'clk_cd8'. The first coarse delayer 111 can receive the reference clock signal 'clk_ref', the second coarse delayer 112 can receive the second coarse delay clock signal 'clk_cd2' the third coarse delayer 113 can receive the fourth coarse delay clock signal 'clk_cd4', and the fourth coarse delayer 114 can receive the sixth coarse delay clock signal 'clk_cd6'.

The first fine delayer 121 can be configured to generate the first fine delay clock signal 'clk_fd1', which can have a phase between the phase of the first coarse delay clock signal 'clk_cd1' and the phase of the second coarse delay clock signal 'clk_cd2' in response to the first and second fine control signals 'ctrl_f1<1:m>' and 'ctrl_f2<1:n>'.

The second fine delayer 122 can be configured to generate the second fine delay clock signal 'clk_fd2', which can have a phase between the phase of the third coarse delay clock signal 'clk_cd3' and the phase of the fourth coarse delay clock signal 'clk_cd4', in response to the first and second fine control signals 'ctrl_f1<1:m>' and 'ctrl_f2<1:n>'.

The third fine delayer 123 can be configured to generate the third fine delay clock signal 'clk_fd3', which can have a phase between the phase of the fifth coarse delay clock signal 'clk_cd5' and the phase of the sixth coarse delay clock signal 'clk_cd6', in response to the first and second fine control signals 'ctrl_f1<1:m>' and 'ctrl_f2<1:n>'.

The fourth fine delayer 124 can be configured to generate the fourth fine delay clock signal 'clk_fd4', which can have a phase between the phase of the seventh coarse delay clock signal 'clk_cd7' and the phase of the eighth coarse delay clock signal 'clk_cd8', in response to the first and second fine control signals 'ctrl_f1<1:m>' and 'ctrl_f2<1:n>'.

Figure 4:
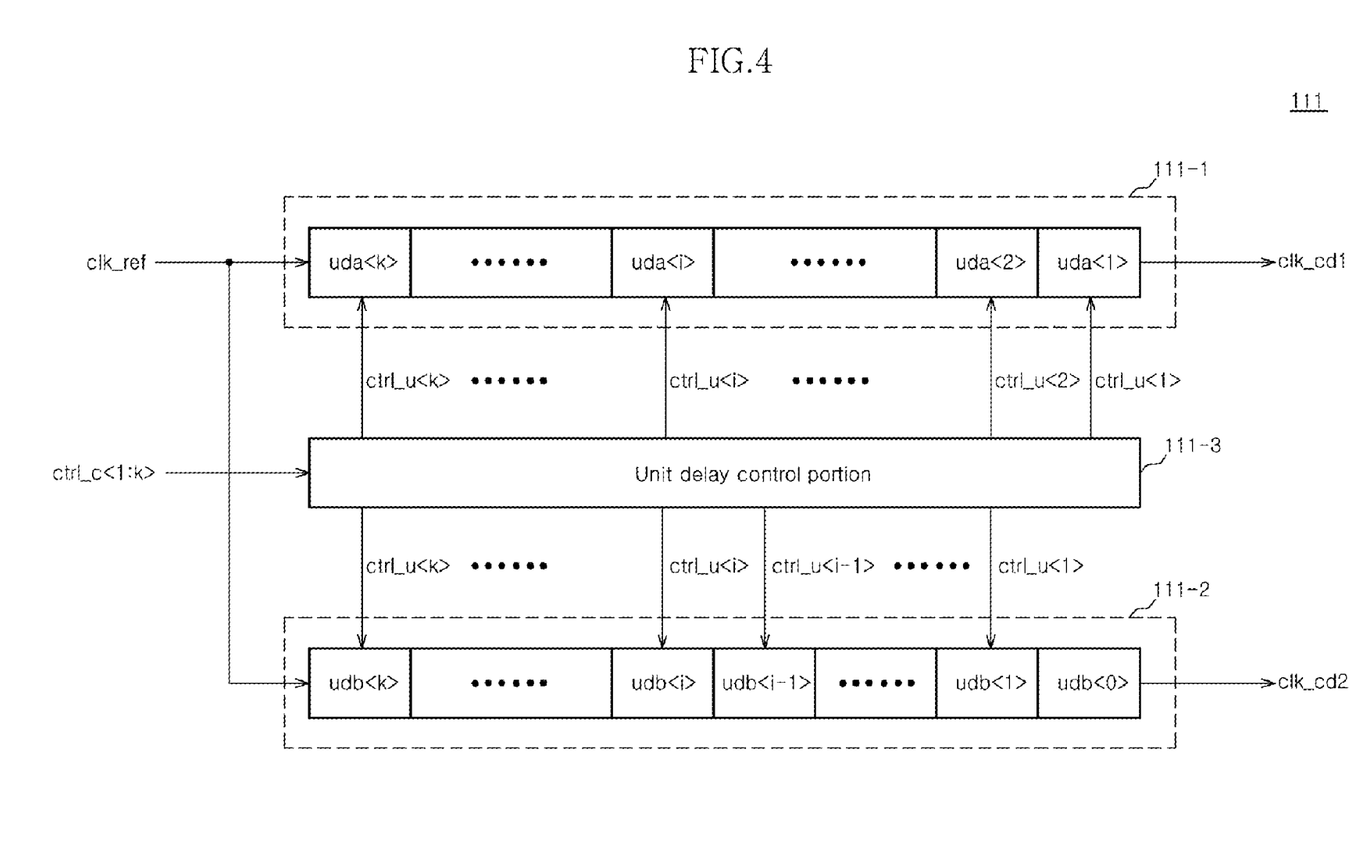
FIG. 4 is a detailed view illustrating a first coarse delayer included in the delay line illustrated in FIG. 3.

As seen in FIG. 4, the first coarse delayer 111 can include first and second unit delay chains 111-1 and 111-2 and a unit delay control portion 111-3.

The first unit delay chain 111-1 can include a plurality of unit delayers uda<1>, uda<2>, . . . and uda<k>, which can be connected in series. The first unit delay chain 111-1 can be configured to determine a delay time in response to unit delay control signals 'ctrl_u<1:k>', delay the reference clock signal 'clk_ref' by the determined delay time, and generate the first coarse delay clock signal 'clk_cd1'.

The second unit delay chain 111-2 can include a plurality of unit delayers udb<0>, udb<1>, . . . and udb<k>, which can be connected in series. The second unit delay chain 111-2 can be configured to determine a delay time in response to the unit delay control signals 'ctrl_u<1:k>', delay the reference clock signal 'clk_ref' by the determined delay time, and generate the second coarse delay clock signal 'clk_cd2'. The second unit delay chain 111-2 can additionally include one unit delayer udb<0> when compared to the first unit delay chain 111-1. Therefore, the second coarse delay clock signal 'clk_cd2' can always be output by further passing through the one additional unit delayer udb<0> when compared to the first coarse delay clock signal 'clk_cd1'.

The unit delay control portion 111-3 can be configured to generate the unit delay control signals 'ctrl_u<1:k>' in response to the coarse control signals 'ctrl_c<1:k>'.

For example, the unit delay control portion 111-3 can be configured such that, when the coarse control signals 'ctrl_c<1:k>' are up-counted, the unit delay control signals 'ctrl_u<1:k>' increase the total delay times of the first and second unit delay chains 111-1 and 111-2. Meanwhile, the unit delay control portion 111-3 can be configured such that, when the coarse control signals 'ctrl_c<1:k>' are down-counted, the unit delay control signals 'ctrl_u<1:k>' decrease the total delay times of the first and second unit delay chains 111-1 and 111-2. At this time, the first and second unit delay chains 111-1 and 111-2 can be configured to increase or decrease the total delay times by recognizing the delay time of one unit delayer as one unit.

The second through fourth coarse delayers 112 through 114 can have the same configuration as the first coarse delayer 111.

The first through fourth fine delayers 121 through 124 can have the same internal configurations except that input clock signals and output clock signals thereof are different from one another. In this sense, only the first fine delayer 121 will be described with reference to FIG. 5.

Figure 5:
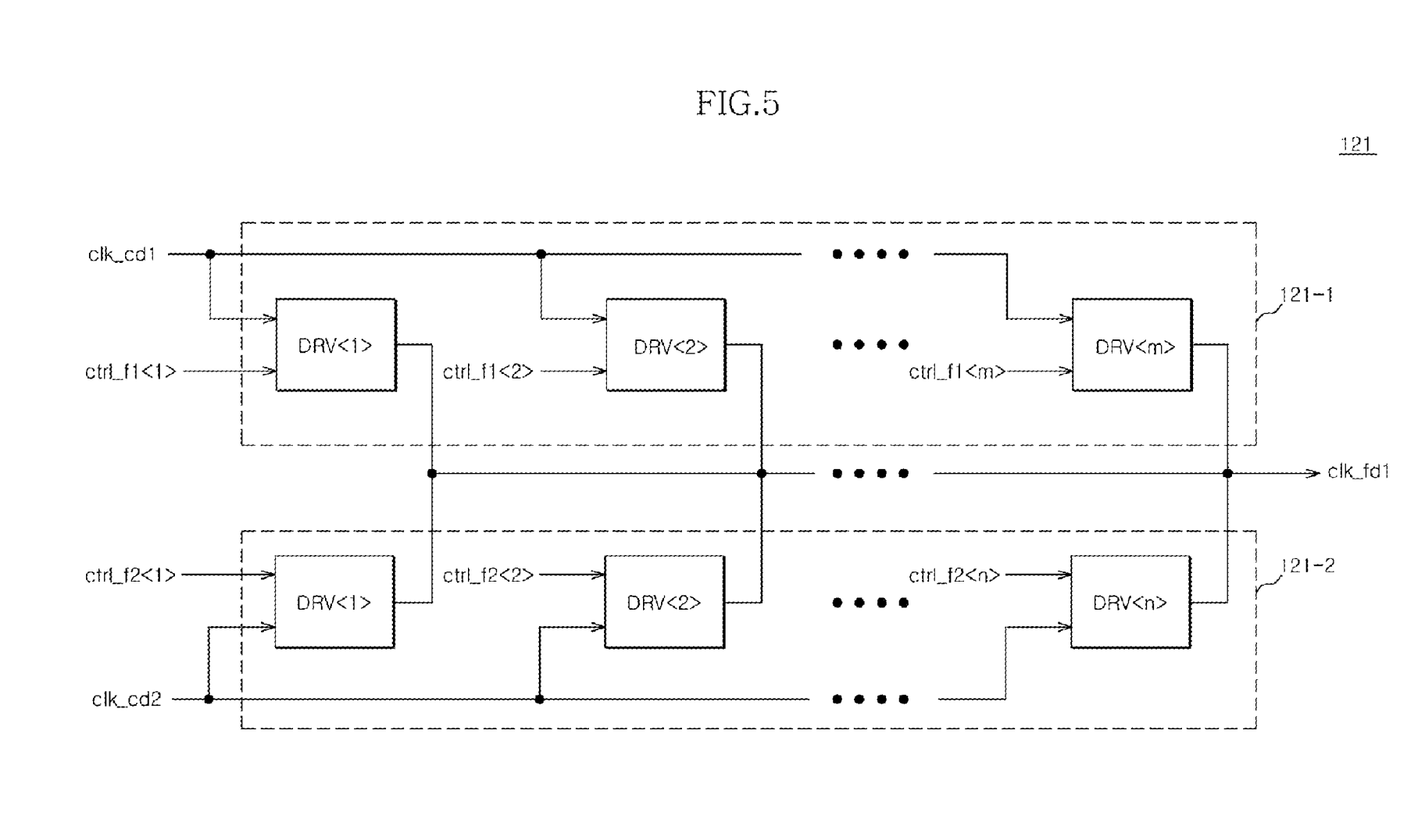
FIG. 5 is a detailed view illustrating a first fine delayer included in the delay line illustrated in FIG. 3.

Referring to FIG. 5, the first fine delayer 121 can include a first driving portion 121-1 and a second driving portion 121-2. The first driving portion 121-1 can include a plurality of drivers DRV<1> through DRV<m>. The number of drivers to be driven is determined in response to the first fine control signals 'ctrl_f1<1:m>'. The driving timing of the respective drivers DRV<1> through DRV<m> of the first driving portion 121-1 can be determined in response to the first coarse delay clock signal 'clk_cd1'. For example, the driving timing, that is, the turn-on timing of the respective drivers DRV<1> through DRV<m> of the first driving portion 121-1 corresponds to when the first coarse delay clock signal 'clk_cd1' has a high level.

The second driving portion 121-2 can include a plurality of drivers DRV<1> through DRV<n>. The number of drivers to be driven can be determined in response to the second fine control signals 'ctrl_f2<1:n>'. The driving timing of the respective drivers DRV<1> through DRV<n> of the second driving portion 121-2 can be determined in response to the second coarse delay clock signal 'clk_cd2'. For example, the driving timing, that is, the turn-on timing of the respective drivers DRV<1> through DRV<n> of the second driving portion 121-2 corresponds to when the second coarse delay clock signal 'clk_cd2' has a high level.

The output terminals of the respective drivers of the first driving portion 121-1 and the second driving portion 121-2 can be commonly connected to one node such that the first fine delay clock signal 'clk_fd1' is output from the node. Hence, when the number of driven drivers in the first driving portion 121-1 is greater than the number of driven drivers in the second driving portion 121-2, the phase of the first fine delay clock signal 'clk_fd1' approaches the phase of the first coarse delay clock signal 'clk_cd1' and when the number of driven drivers in the second driving portion 121-2 is greater than the number of driven drivers in the first driving portion 121-1, the phase of the first fine delay clock signal 'clk_fd1' approaches the phase of the second coarse delay clock signal 'clk_cd2'.

The operation of the DLL circuit 11 will now be described in detail below.

The external clock signal 'clk_ext' can be input as the reference clock signal 'clk_ref' to the delay line 100 and the delay control section 200 through the clock input buffer 10. The reference clock signal 'clk_ref' can be input to the coarse delay chain 110 of the delay line 100. The first coarse delayer 111 can then determine a delay time in response to the coarse control signals 'ctrl_c<1:k>', delay the reference clock signal 'clk_ref' by the determined delay time, and generate the first and second coarse delay clock signals 'clk_cd1' and 'clk_cd2'.

The second coarse delayer 112 can determine a delay time in response to the coarse control signals 'ctrl_c<1:k>', delay the second coarse delay clock signal 'clk_cd2' by the determined delay time, and generate the third and fourth coarse delay clock signals 'clk_cd3' and 'clk_cd4'. The third coarse delayer 113 can determine a delay time in response to the coarse control signals 'ctrl_c<1:k>', delay the fourth coarse delay clock signal 'clk_cd4' by the determined delay time, and generate the fifth and sixth coarse delay clock signals 'clk_cd5' and 'clk_cd6'. The fourth coarse delayer 114 can determine a delay time in response to the coarse control signals 'ctrl_c<1:k>', delay the sixth coarse delay clock signal 'clk_cd6' by the determined delay time, and generate the seventh and eighth coarse delay clock signals 'clk_cd7' and 'clk_cd8'.

The eighth coarse delay clock signal 'clk_cd8' can be received as the coarse feedback clock signal 'clk_cfb' by the first phase comparator 211 of the delay control section 200. The first phase comparator 211 can then compare the phases of the coarse feedback clock signal 'clk_cfb' with the reference clock signal 'clk_ref' and generate the first comparison signal 'com1'. The first counter 212 can up-count or down-count the coarse control signals 'ctrl_c<1:k>' in response to the first comparison signal 'com1'.

The first fine delayer 121 can generate the first fine delay clock signal 'clk_fd1', which can have a phase between the phase of the first coarse delay clock signal 'clk_cd1' and the phase of the second coarse delay clock signal 'clk_cd2', in response to the first and second fine control signals 'ctrl_f1<1:m>' and 'ctrl_f2<1:n>'.

The second fine delayer 122 can generate the second fine delay clock signal 'clk_fd2', which can have a phase between the phase of the third coarse delay clock signal 'clk_cd3' and the phase of the fourth coarse delay clock signal 'clk_cd4', in response to the first and second fine control signals 'ctrl_f1<1:m>' and 'ctrl_f2<1:n>'.

The third fine delayer 123 can generate the third fine delay clock signal 'clk_fd3', which can have a phase between the phase of the fifth coarse delay clock signal 'clk_cd5' and the phase of the sixth coarse delay clock signal 'clk_cd6', in response to the first and second fine control signals 'ctrl_f1<1:m>' and 'ctrl_f2<1:n>'.

The fourth fine delayer 124 can generate the fourth fine delay clock signal 'clk_fd4', which can have a phase between the phase of the seventh coarse delay clock signal 'clk_cd7' and the phase of the eighth coarse delay clock signal 'clk_cd8', in response to the first and second fine control signals 'ctrl_f1<1:m>' and 'ctrl_f2<1:n>'. The fourth fine delay clock signal 'clk_fd4' can be output as the fine feedback clock signal 'clk_ffb'.

The second phase comparator 221 of the delay control section 200 can compare the phases of the reference clock signal 'clk_ref' with the fine feedback clock signal 'clk_ffb' and generate the second comparison signal 'com2'. The second counter 222 can up-count or down-count the first fine control signals 'ctrl_f1<1:m>' in response to the second comparison signal 'com2'. The third counter 223 can up-count or down-count the second fine control signals 'ctrl_f2<1:n>' in response to the second comparison signal 'com2'. At this time, if the second counter 222 implements up-counting, the third counter 223 can implement down-counting, and if the second counter 222 implements down-counting, the third counter 223 can implements up-counting.

The duty cycle correction section 20 can have four unit duty cycle correctors, which are generally known in the art. The respective unit duty cycle correctors can be configured to correct the duty ratios of the first through fourth fine delay clock signals 'clk_fd1' 'clk_fd2', 'clk_fd3' and 'clk_fd4' and generate the first through fourth internal clock signals 'clk_out1', 'clk_out2', 'clk_out3' and 'clk_out4'.

A DLL circuit 11 configured as described herein can output a large amount of data because a plurality of internal clock signals having different phases are generated within one period of a reference clock signal.

Also, in the data output speed of a DLL circuit 11 configured as described herein can be increased, because the plurality of internal clock signals having different phases are generated.

Moreover, due to the fact that the DLL circuit 11 includes a plurality of coarse delayers and a plurality of fine delayers, replica circuits, which are provided in a conventional DLL circuit to control the timing of clock signals, are not needed.

For example, when it is necessary of a DLL circuit 11 to generate first through fourth internal clock signals, regarding the second internal clock signal, a coarse delayer for generating the first internal clock signal can replace a conventional replica circuit. Also, regarding the third internal clock signal, two coarse delayers for generating the first and second internal clock signals, which are connected in series, can replace a conventional replica circuit, and regarding the fourth internal clock signal, three coarse delayers for generating the first through third internal clock signals, which are connected in series, can replace a conventional replica circuit. Therefore, in a DLL circuit 11 configured as described herein, higher integration can be achieved due to the elimination of the replica circuits.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. A DLL circuit for a semiconductor memory apparatus, comprising:
    a delay line having a coarse delay chain, which has a plurality of coarse delayers connected in series and receives a reference clock signal, and a plurality of fine delayers, which receive output clock signals of the respective coarse delayers;
    a delay control section configured to compare phases of an output clock signal of a final coarse delayer among the coarse delayers with the reference clock signal thereby generating coarse control signals for controlling the coarse delayers, and to compare phases of a fine feedback clock signal with the reference clock signal thereby generating fine control signals for controlling the fine delayers; and
    a duty cycle correction section configured to correct duty ratios of clock signals outputted by the fine delayers thereby generating internal clock signals,
    wherein the fine feedback clock signal is an output clock signal of a fine delayer received with the output clock signals of the final coarse delayer,
    wherein the delay line receives the coarse control signals and the fine control signals, and outputs, as output signals, the clock signals outputted by the fine delayers that receive the fine control signals,
    wherein each of the fine delayers delays output clock signals of a corresponding one coarse delayer among the coarse delayers in response to the fine control signals, and
    wherein each of the fine delayers lacks an input-output relationship with others of the fine delayers.

2. The DLL circuit according to claim 1, wherein a total delay time of the coarse delay chain corresponds to one period of the reference clock signal.

3. The DLL circuit according to claim 2, wherein each coarse delayer comprises:
    a first unit delay chain having a plurality of unit delayers connected in series and configured to generate a first coarse delay clock signal;
    a second unit delay chain having a plurality of unit delayers connected in series and configured to generate a second coarse delay clock signal; and
    a unit delay control portion configured to generate unit delay control signals for controlling the first unit delay chain and the second unit delay chain, in response to the coarse control signals.

4. The DLL circuit according to claim 3, wherein delay times of the first unit delay chain and the second unit delay chain are determined by the numbers of unit delayers that are enabled in response to the unit delay control signals.

5. The DLL circuit according to claim 4, wherein the second unit delay chain is configured to generate the second coarse delay clock signal, which is further delayed than the first coarse delay clock signal by a delay time of one unit delayer.

6. The DLL circuit according to claim 1, wherein each coarse delayer is configured to output a first coarse delay clock signal and a second coarse delay clock signal, and wherein the delay control section is configured to generate a first fine control signals and second fine control signals, and wherein each fine delayer is configured to output a fine delay clock signal, and wherein each fine delayer comprises a first driving portion having a plurality of drivers, which are turned on in response to the first fine control signal and a second driving portion having a plurality of drivers, which are turned on in response to the second fine control signals, and a node, to which the respective drivers of the first driving portion and the respective drivers of the second driving portion are connected, thereby generating the fine delay clock signal which has a phase between phases of the first coarse delay clock signal and the second coarse delay clock signal.

7. The DLL circuit according to claim 6, wherein the first driving portion is configured to have the plurality of drivers, which respectively receive the first fine control signals and to commonly receive the first coarse delay clock signal, and wherein the second driving portion is configured to have the plurality of drivers, which respectively receive the second fine control signals, and to commonly receive the second coarse delay clock signal.

8. The DLL circuit according to claim 1, wherein the delay control section comprises:
    a coarse delay control section configured to compare phases of the output clock signal of the final coarse delayer with the reference clock signal and generate the coarse control signals; and
    a fine delay control section configured to compare phases of the fine feedback clock signal with the reference clock signal and generate the fine control signals.

9. The DLL circuit according to claim 8, wherein the coarse delay control section comprises:
    a phase comparator configured to compare the phases of the output clock signal of the final coarse delayer with the reference clock signal and generate a comparison signal; and
    a counter configured to generate the coarse control signals in response to the comparison signal.

10. The DLL circuit according to claim 9, wherein the counter is configured to implement up-counting or down-counting in response to the comparison signal.

11. The DLL circuit according to claim 8, wherein the fine delay control section is configured to output the first fine control signals and the second fine control signals, and wherein the fine delay control section comprises:
    a phase comparator configured to compare the phases of the fine feedback clock signal with the reference clock signal and generate a comparison signal,
    a first counter configured to generate the first fine control signals in response to the comparison signal, and
    a second counter configured to generate the second fine control signals in response to the comparison signal.

12. A DLL circuit for a semiconductor memory apparatus, comprising:
    a delay line for delaying a reference clock signal in response to coarse control signals and fine control signals thereby generating a plurality of fine delay clock signals of different phases and a coarse feedback clock signal; and a delay control section for comparing phases of the coarse feedback clock signal with the reference clock signal thereby generating the coarse control signals and for receiving a fine delay clock signal of a latest phase among the plurality of fine delay clock signals as a fine feedback clock signal, comparing phases of the fine feedback clock signal with the reference clock signal, and generating the fine control signals, wherein the delay line includes a coarse delay chain and a plurality of fine delayers, receives the coarse control signals and the fine control signals, and outputs the coarse feedback clock signal and the fine delay clock signals outputted by the plurality of fine delayers that receive the fine control signals, wherein the fine delayers receive output signals of the coarse delay chain, wherein each of the fine delayers delays output signals of a corresponding one coarse delayer among the coarse delayers in response to the fine control signals, and wherein each of the fine delayers lacks an input-output relationship with others of the fine delayers.

13. The DLL circuit according to claim 12, wherein the delay line comprises:
the coarse delay chain in which a plurality of coarse delayers determined in their delay times in response to the coarse control signals are connected in series and which is inputted with the reference clock signal and has a total delay time corresponding to one period of the reference clock signal; and
the plurality of fine delayers for receiving output clock signals of the coarse delayers and generating the fine delay clock signals in response to the fine control signals.

14. The DLL circuit according to claim 13, wherein each coarse delayer is configured to generate a first coarse delay clock signal and a second coarse delay clock signal; and the coarse delayers of the coarse delay chain are configured to respectively input with second coarse delay clock signals which are outputted from preceding coarse delayers.

15. The DLL circuit according to claim 14, wherein each coarse delayer comprises:
a first unit delay chain having a plurality of unit delayers connected in series and generating the first coarse delay clock signal;
a second unit delay chain having a plurality of unit delayers connected in series and generating the second coarse delay clock signal which is further delayed by a delay time of one unit delayer when compared to the first coarse delay clock signal; and
a unit delay control portion generating unit delay control signals for controlling the respective unit delayers of the first unit delay chain and the second unit delay chain in response to the coarse control signals and for determining delay times.

16. The DLL circuit according to claim 13, wherein the delay control section is configured to output first fine control signals and second fine control signals, and each coarse delayer is configured to output the first coarse delay clock signal and the second coarse delay clock signal; wherein each fine delayer comprises:
a first driving portion which has a plurality of drivers and in which the number of drivers to be turned on is determined in response to the first fine control signals and turn-on timing of the drivers to be turned on responses to the first coarse delay clock signal, and
a second driving portion which has a plurality of drivers and in which the number of drivers to be turned on is determined in response to the second fine control signals and turn-on timing of the drivers to be turned on responses to the second coarse delay clock signal; and
wherein each fine delay clock signal is outputted from a node to which output terminals of the respective drivers of the first driving portion and the respective drivers of the second driving portion are connected.

17. The DLL circuit according to claim 16, wherein each coarse delayer is configured to output the first coarse delay clock signal and the second coarse delay clock signal and the delay control section is configured to output the first fine control signals and the second fine control signals; and
wherein the delay control section comprises:
a coarse delay control section for comparing phases of the second coarse delay clock signal of a final coarse delayer among the coarse delayers with the reference clock signal and generating the coarse control signals, and
a fine delay control section for comparing phases of the fine delay clock signal outputted from a fine delayer which is inputted with the first coarse delay clock signal and the second coarse delay clock signal from the final coarse delayer with the reference clock signal and generating the first fine control signals and the second fine control signals.

18. The DLL circuit according to claim 17, wherein the coarse delay control section comprises:
a phase comparator for comparing the phases of the second coarse delay clock signal of the final coarse delayer with the reference clock signal and generating a comparison signal; and
a counter for up-counting or down-counting the coarse control signals in response to the comparison signal.

19. The DLL circuit according to claim 18, wherein the fine delay control section comprises:
a phase comparator for comparing the phases of the fine delay clock signal outputted from the fine delayer, which is inputted with the first coarse delay clock signal and the second coarse delay clock signal from the final coarse delayer with the reference clock signal and generating a comparison signal;
a first counter for up-counting or down-counting the first fine control signals in response to the comparison signal; and
a second counter for up-counting or down-counting the second fine control signals in response to the comparison signal.

20. A DLL circuit for a semiconductor memory apparatus, comprising:
a delay line having a coarse delay chain which has a plurality of coarse delayers connected in series to delay a reference clock signal, for generating an output clock signal of a final coarse delayer to have the same phase with the reference clock signal, and a plurality of fine delayers for delaying output clock signals of the respective coarse delayers in response to fine control signals and generating fine delay clock signals; and
a delay control section for comparing phases of a fine delay clock signal in the fine delay clock signals generated by receiving the output clock signal of the final coarse delayer with the reference clock signal and generating the fine control signals,
wherein the fine delayers receive the output clock signals of the coarse delayers respectively, and the delay control section receives the fine delay clock signal outputted by the fine delayer that receives output clock signals of the final coarse delayer and the output clock signal of the final coarse delayer, and the plurality of fine delayers receives the fine control signals to output the fine delay clock signals, and wherein each of the fine delayers delays output clock signals of a corresponding one coarse delayer among the coarse delayers in response to the fine control signals, and wherein each of the fine delayers lacks an input-output relationship with others of the fine delayers.

21. The DLL circuit according to claim 20, wherein the coarse delay chain having a coarse delay control section for comparing phases of an output clock signal of the final coarse delayer with the reference clock signal and controlling delay times of the coarse delayers.

22. The DLL circuit according to claim 21, wherein the coarse delay control section comprises:
   a phase comparator for comparing the phases of the output clock signal of the final coarse delayer with the reference clock signal and generating a comparison signal; and
   a counter for up-counting or down-counting coarse control signals for controlling the delay times of the coarse delayers, in response to the comparison signal.

23. The DLL circuit according to claim 21, wherein each coarse delayer comprises:
   a unit delay chain having a plurality of unit delayers which are connected in series; and
   a unit delay control portion for generating unit delay control signals for controlling a delay time of the unit delay chain, in response to the coarse control signals.

24. The DLL circuit according to claim 23, wherein each fine delayer comprises:
   a first driving portion in which a plurality of drivers are turned on in response to a coarse delay clock signal and the number of drivers to be turned on is determined in response to the fine control signals, and
   a second driving portion in which a plurality of drivers are turned on in response to a clock signal further delayed by a delay time of one unit delayer when compared to the coarse delay clock signal and the number of drivers to be turned on is determined in response to the fine control signals; and
   wherein each fine delay clock signal is outputted from a node to which output terminals of the respective drivers of the first driving portion and the second driving portion are connected.

25. The DLL circuit according to claim 20, wherein the delay control section comprises:
   a phase comparator for comparing the phases of the fine delay clock signal generated by receiving the output clock signals of the final coarse delayer with the reference clock signal and generating a comparison signal; and
   a counter for up-counting or down-counting the fine control signals in response to the comparison signal.

* * * * *